(12) United States Patent  (10) Patent No.: US 11,487,401 B2
Tustin et al.  (45) Date of Patent: Nov. 1, 2022

(54) SYSTEM AND METHOD FOR SELECTIVELY DISPLAYING WAVEFORMS USING GRAPHICAL USER INTERFACE

(71) Applicant: Keysight Technologies, Inc., Santa Rosa, CA (US)

(72) Inventors: Warren S. Tustin, Colorado Springs, CO (US); Douglas James Beck, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/836,260

(22) Filed: Mar. 31, 2020

(65) Prior Publication Data

US 2021/0303111 A1  Sep. 30, 2021

(51) Int. Cl.
*G06F 3/0482* (2013.01)
*G01R 31/317* (2006.01)
*G06F 3/0483* (2013.01)

(52) U.S. Cl.
CPC ......... *G06F 3/0482* (2013.01); *G01R 31/317* (2013.01); *G06F 3/0483* (2013.01)

(58) Field of Classification Search
CPC ...... G06F 3/0482; G06F 3/0483; G06F 11/32; G06F 11/321; G06F 11/323; G06F 11/322; G06F 11/324; G01R 31/317; G01R 13/00; G01R 13/408; G06T 11/206; G09G 1/162
See application file for complete search history.

(56) References Cited

U.S. PATENT DOCUMENTS

| 6,269,325 | B1 * | 7/2001 | Lee | G06F 30/20 |
| | | | | 703/2 |
| 8,341,541 | B2 * | 12/2012 | Holecek | G06F 16/904 |
| | | | | 715/782 |
| 8,624,580 | B2 * | 1/2014 | Reich | G01R 13/029 |
| | | | | 345/440.1 |
| 2002/0154118 | A1 * | 10/2002 | McCarthy | G06T 11/206 |
| | | | | 715/788 |
| 2003/0193525 | A1 * | 10/2003 | Nygaard, Jr. | G06F 3/0482 |
| | | | | 715/810 |
| 2004/0122643 | A1 * | 6/2004 | Anderson | G06F 30/367 |
| | | | | 703/14 |

(Continued)

FOREIGN PATENT DOCUMENTS

JP  2003172749 A  *  6/2003
JP  3635149 B2  *  4/2005

*Primary Examiner* — Kieu D Vu
*Assistant Examiner* — Blaine T Basom

(57) ABSTRACT

A method and test system are provided for selectively emphasizing waveforms on a display of the test system. The method includes presenting a graphical user interface (GUI) on the display of the test system; receiving through the GUI a selection of channels to be viewed on the display; receiving through the GUI an indication enabling a waveform emphasis feature; receiving through the GUI an indication of a cycle time; and displaying through the GUI multiple waveforms, respectively produced by the selected channels, by sequentially emphasizing each waveform of the multiple waveforms for the cycle time as a viewable waveform, while de-emphasizing each remaining waveforms of the multiple waveforms in relation to the emphasized waveform for the cycle time.

17 Claims, 10 Drawing Sheets

(56) References Cited

U.S. PATENT DOCUMENTS

| | | | |
|---|---|---|---|
| 2008/0078811 A1* | 4/2008 | Hillen | B23K 9/095 |
| | | | 228/101 |
| 2013/0229416 A1* | 9/2013 | Krajec | G06F 11/302 |
| | | | 345/440 |
| 2019/0090768 A1 | 3/2019 | Oikawa | |

* cited by examiner

SYSTEM AND METHOD FOR SELECTIVELY DISPLAYING WAVEFORMS USING GRAPHICAL USER INTERFACE

BACKGROUND

Conventional test systems, such as oscilloscopes, are capable of displaying waveforms of signals received at multiple channels from devices under test. These waveforms may be displayed simultaneously in one window of the display, in which case the may be color keyed in order to help the user to distinguish among them. However, the information contained in any one waveform may be difficult to see, even when color keyed, due to crowding of the waveforms in a single display window, particularly when there are more than two or three channels being observed. Another option is to display the waveforms simultaneously in separate grid areas of the same display window. In this case, the information in any one waveform may be easier to distinguish, but the viewing area for each waveform becomes smaller as the more waveforms are displayed, eventually running out of space.

In addition, the conventional test systems enable the waveforms from the multiple channels to be displayed in their own corresponding windows, such that only one waveform is viewable in its entirety on the display at a time. This helps the user to better see the information contained in each waveform because the display area is not crowded with multiple waveforms and/or the viewing area is larger. However, the user must manually switch windows in order to view another window showing another waveform. Switching windows may be inconvenient, particularly if the user is using both hands to probe one or more devices under test. Also, switching among windows is not conducive to visually comparing the information contained in multiple waveforms.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
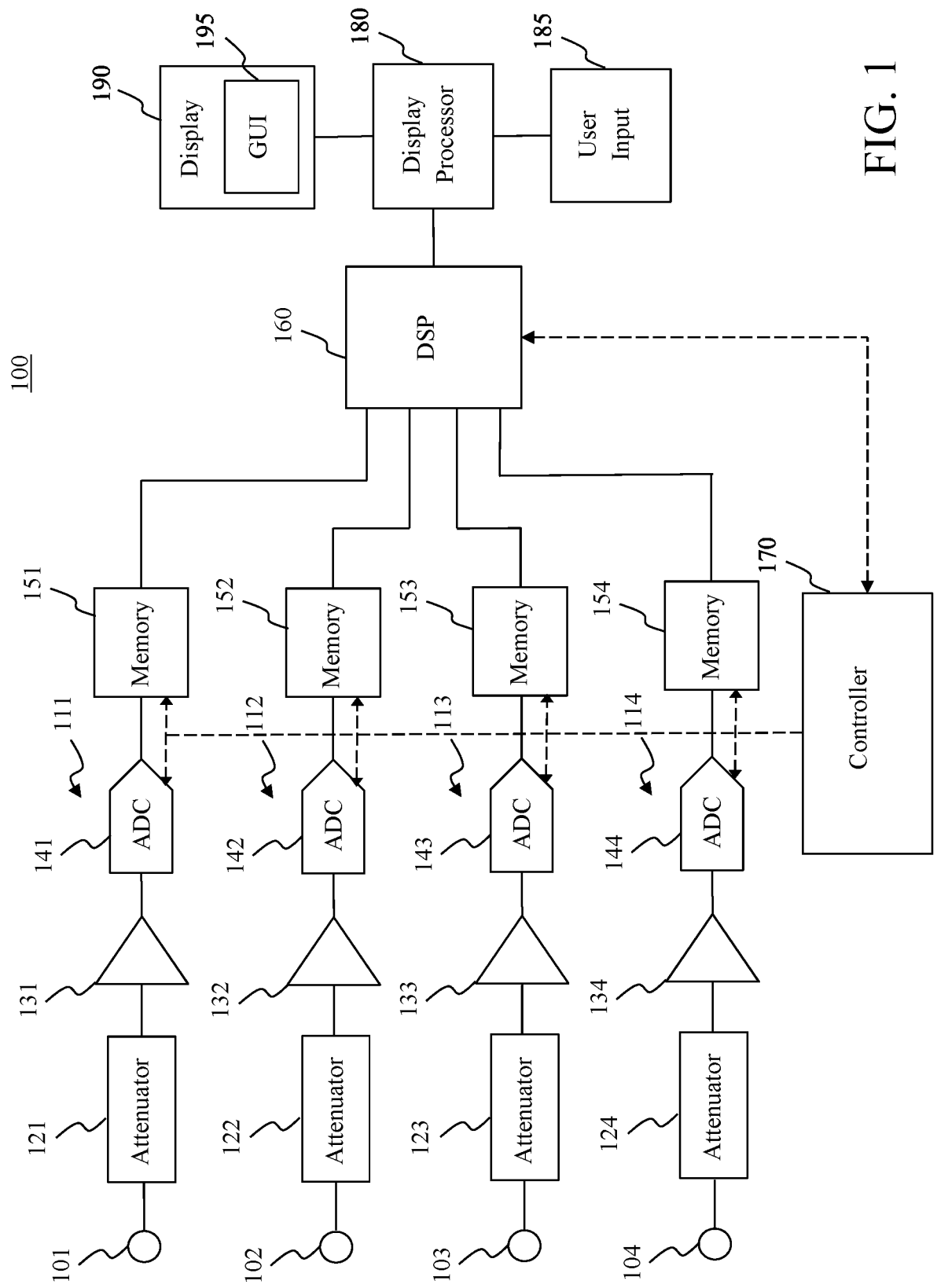
FIG. 1 is a simplified block diagram showing a test system including a graphical user interface (GUI) for selectively emphasizing waveforms, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to various embodiments, waveforms from multiple channels of a test system, such as a digital storage oscilloscope (DSO), are selectively emphasized (highlighted) on the display of the test system using a graphical user interface (GUI). The waveforms may be displayed in a single window of the display, in which case the GUI enables each waveform to be sequentially emphasized over the other waveforms for a cycle time, entered by the user. The emphasized waveform is more clearly viewable than the other (de-emphasized) waveforms for the cycle time, after which each subsequent waveform is emphasized over the other waveforms for the cycle time. Alternatively, each of the waveforms may be displayed in its own window of the display, in which case the GUI enables each waveform to be sequentially emphasized over the other waveforms by positioning the window containing the emphasized waveform to the foreground of the display for a cycle time, entered by the user. The window in the foreground at least partially obscures the windows containing the other (de-emphasized) waveforms for the cycle time, after which each subsequent waveform is emphasized over the other waveforms for the cycle time by positioning the respective window to the foreground of the display. The waveforms are selectively emphasized for the cycle time automatically, so that after setting the cycle time using the GUI, the user does not need to take any further action to observer the different views.

In alternative embodiments, the waveforms from the channels of the test system may be selectively emphasized using the GUI without a cycle time. In this case, a selected waveform shown in the same window with other waveforms is emphasized indefinitely over the other waveforms, until the user unselects the waveform or selects another waveform to be emphasized. Similarly, a selected waveform displayed in its own window is emphasized by positioning the window in the foreground indefinitely, in front of the windows displaying the other waveforms, until the user unselects the waveform or selects another waveform to be emphasized.

FIG. 1 is a simplified block diagram of a test system including a GUI for selectively emphasizing waveforms on a display, according to a representative embodiment.

Referring to FIG. 1, a test system 100 includes multiple channels for receiving signals, for example, from one or more devices under tests, and displays corresponding waveforms provided by the channels on a display 190, which includes a graphical user interface (GUI) 195. The test system 100 may be implemented as a digital storage oscilloscope, for example, although other types of measurement instruments and systems capable of measuring and displaying electronic signals may be included, without departing from the scope of the present teachings. Also, although the test system 100 is shown with four channels, for purposes of illustration, it is understood that the discussion herein applies to test systems having any number of multiple channels. It is further assumed for purpose of illustration that signals are received on all four of the representative channels. However, it is understood that signals may be received on any two or more of the multiple channels.

In the depicted embodiment, the test system 100 includes a first channel 111 for receiving a first signal through a first input 101, a second channel 112 for receiving a second signal through a second port 102, a third channel 113 for receiving a third signal through a third port 103, and a fourth channel 114 for receiving a fourth signal through a fourth port 104. The first channel 111 includes a first attenuator 121, a first amplifier 131 and a first analog to digital converter (ADC) 141. The first attenuator 121 is configured to reduce power of the first signal input to the test system 100 at the first input 101 to a predetermined level within the capability of the first amplifier 131, and to provide offset, if needed. The first amplifier 131 may be a vertical amplifier, and is configured to amplify the attenuated signal by a fixed gain, providing stability and establishing bandwidth of the test system 100. The first ADC 141 digitizes the amplified signal at a predetermined sampling rate to provide a first waveform corresponding to the first signal. The first waveform is stored in a first memory 151, and is output from the first memory 151 to a digital signal processor (DSP) 160 under control of controller 170, discussed below.

Each of the other channels has essentially the same configuration. That is, the second channel 112 includes a second attenuator 122, a second amplifier 132 and a second ADC 142, the third channel 113 includes a third attenuator 123, a third amplifier 133 and a third ADC 143, and the fourth channel 114 includes a fourth attenuator 124, a fourth amplifier 134 and a fourth ADC 144. A second waveform provided by the second ADC 142 is stored in a second memory 152, a third waveform provided by the third ADC 143 is stored in a third memory 153, and a fourth waveform provided by the fourth ADC 144 is stored in a fourth memory 154. The stored first, second, third and fourth waveforms are likewise output to the DSP 160 under control of the controller 170. Each of the first, second, third and fourth memories 151, 152, 153 and 154 may be buffer memories, for example.

The controller 170 may be implemented as a processing unit. As used herein, a processing unit may include one or more computer processors, field-programmable gate arrays (FPGAs), application specific integrated circuits (ASICs), or combinations thereof, using any combination of hardware, software, firmware, hard-wired logic circuits, or combinations thereof. The processing unit may include its own processing memory for storing computer readable code (e.g., software, software modules) that enables performance of the various functions described herein. As used herein, a processing memory, and any other memory (and databases) described herein, may be various types of random access memory (RAM), read only memory (ROM) and/or other storage media, including flash memory, electrically programmable read-only memory (EPROM), electrically erasable and programmable read only memory (EEPROM), compact disk read only memory (CD-ROM), digital versatile disk (DVD), registers, latches, flip-flops, a hard disk, a removable disk, tape, floppy disk, blu-ray disk, or universal serial bus (USB) driver, or any other form of storage medium known in the art, which are tangible and non-transitory (e.g., as compared to transitory propagating signals). Memories may be volatile or non-volatile, secure and/or encrypted, unsecure and/or unencrypted, without departing from the scope of the present teachings.

The controller 170 executes the control logic of the test system 100 for coordinating the acquisition, timing and display of the first, second, third and fourth waveforms received from the first, second, third and fourth channels 111, 112, 113 and 114, respectively. This is accomplished by controlling operations of the first, second, third and fourth ADCs 141, 142, 143 and 144, the first, second, third and fourth memories 151, 152, 153 and 154, and the DSP 160, as indicated by the dashed arrows from the controller 170. When the test system 100 is an oscilloscope, for example, the control logic triggers sweeps for displaying the waveforms. The controller 170 may also include as inputs an external trigger and a clock (not shown) for purposes of coordinating operations. The control logic may also set a time base, which effectively controls a horizontal (time) axis on the display 190. The time base may be adjusted by trigger points to capture and hold periodic waveforms, for example.

The DSP 160 receives the waveforms provided the first, second, third and fourth channels 111, 112, 113 and 114 from the first, second, third and fourth memories 151, 152, 153 and 154, respectively. The DSP 160 processes the waveforms for display on the display 190 in graph format, effectively reconstructing a close approximation to the original input signals. The DSP 160 is implemented as a processing unit with a corresponding processing memory, as discussed above.

The test system 100 further includes a display processor 180, an interface 185 and the display 190. The display 190 is any type of compatible display or monitor capable of displaying waveforms provided by the DSP 160 under control of the display processor 180. For example, the display 190 may be a liquid crystal display (LCD), an organic light emitting diode (OLED), a flat panel display, a solid-state display, a computer monitor, or a television, for example. The display 190 includes a GUI 195 for displaying and receiving information to and from a user on the display 190. The display 190 may be included in the same device or instrument that contains the first, second, third and fourth channels 111, 112, 113 and 114, or it may be in a separate device, without departing from the scope of the present teachings.

The display processor 180 is implemented as a processing unit with a corresponding processing memory, as discussed above. That is, the display processor 180 may include one or more computer processors, FPGAs, ASICs, or combinations thereof, using any combination of hardware, software, firmware, hard-wired logic circuits, or combinations thereof. The processing memory stores computer readable code (e.g., software, software modules) that enables performance of the various functions described herein. For example, the processing memory may store software instructions/computer readable code executable by the processing unit (e.g., computer processor) for performing some or all aspects of methods described herein, including various steps of the method described below with reference to FIGS. 2, 4 and 6. For example, execution of the instructions/computer readable code generally causes the display processor 180 to present the GUI 195 on the display 190, to receive through the GUI 195 a selection of channels from among the first, second, third and fourth channels 111, 112, 113 and 114 to be viewed on the display 190, to receive through the GUI 195 an activation of a waveform emphasis feature, to receive through the GUI 195 an indication of a cycle time, and to display through the GUI 195 the waveforms respectively produced by selected channels. The waveforms may be displayed by sequentially emphasizing each waveform on the display 190 for the cycle time, e.g., by highlighting the waveform to emphasize it over other simultaneously displayed waveforms in the same window, or by positioning a window showing the waveform in front of other windows showing the other waveforms, obscuring the other waveforms. Execution of the instructions/computer readable code may also cause the display processor 180 to present the GUI 195 on the display 190, to receive through the GUI 195 a selection of a channel from among the first, second, third and fourth channels 111, 112, 113 and 114 to be emphasized on the display 190, and to display the waveform corresponding to the selected channel on the display 190 through the GUI 195.

The interface 185 may include a user interface and/or a network interface for providing information and data output by the display processor 180 to the user and/or for receiving information and data input by the user. That is, the interface 185 enables the user to enter data and to control or manipulate aspects of the GUI 195, and also enables the display processor 180 to indicate the effects of the user's control or manipulation. The interface 185 may include one or more of ports, disk drives, wireless antennas, or other types of receiver circuitry. The interface 185 may further connect one or more user interfaces, such as a mouse, a keyboard (physical or virtual), a mouse, a trackball, a joystick, a microphone, a video camera, a touchpad, voice or gesture recognition captured by a microphone or video camera, for example. In an embodiment, the interface 185 includes a touch screen, in which case the interface 185 is physically located at the display 190, although it is depicted separately.

Figure 2:
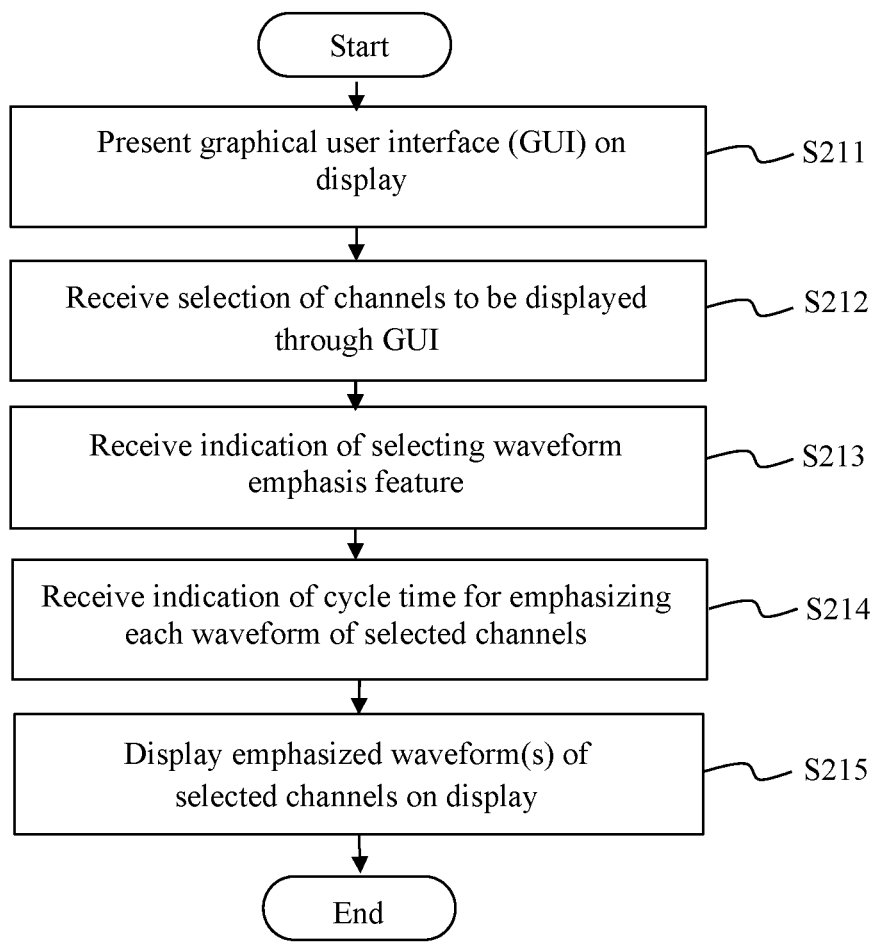
FIG. 2 is a simplified flow diagram showing a method for selectively emphasizing waveforms on a display of a test system, according to a representative embodiment.

FIG. 2 is a simplified flow diagram showing a method for selectively emphasizing waveforms on a display of a test system, such as an oscilloscope or other measurement instrument, according to a representative embodiment. The method may be implemented using the test system 100 shown in FIG. 1, for example.

Referring to FIG. 2, a GUI is presented on a display of the test system in block S211. The GUI displays graphical elements that enable a user to interface with the test system, and more particularly, with the display itself. The graphical elements displayed by the GUI may include various windows, tabs, selectable icons, buttons, fields and scrolling features, for example, although any type of graphical element that enables interaction between the user and the test system may be incorporated without departing from the scope of the present teachings. As mentioned above, the user is able to view the GUI on the display and interact with the GUI using a variety of user interfaces, such as a touch screen, a touch pad, a mouse and/or a keyboard, for example.

In block S212, input is received through the GUI indicating a selection of channels from among multiple channels of the test instrument to be viewed on the display. For example, the GUI may include buttons or icons corresponding to the channels, and the user is able to select the buttons or icons using the user interface to indicate the channels to be displayed. The multiple channels respectively produce waveforms from signals received through corresponding inputs. The waveforms associated with the channels are provided to the GUI through a DSP and a display processor, as discussed above.

In block S213, input is received through the GUI indicating selection by the user of a waveform emphasis feature. For example, the GUI may include a button or a box that can be selected for turning the waveform emphasis feature on or off. The type of waveform emphasis feature that is used depends in part on the display format selected by the user, which may also be input through the GUI. For example, various display formats may include overlay waveforms, separate waveforms, tile waveforms and/or windows for displaying the waveforms from the selected channels, with or without waveform emphasis. All of the waveforms are displayed in the same window in each of the overlay waveforms, separate waveforms and tile waveforms display formats. That is, all of the waveforms are displayed in the same grid in overlay waveforms display format; all of the waveforms are displayed in separate, vertically stacked grids in the separate waveforms display format; and all of the waveforms are displayed in separate, divided portions (e.g., quarters) of the display in the tile waveforms display format. In the windows display format, each waveform is displayed in its own window, where the window being viewed partially or fully hides the other windows containing waveforms. The windows may be tabbed, such that tabs respectively corresponding to the windows remain visible to enable selecting the windows while one of the windows is in the foreground hiding the other tabbed windows.

Therefore, for example, when the waveforms from the selected channels are displayed in a single window at the same time, the waveform emphasis feature may include sequentially highlighting each of the displayed waveforms relative to the remaining displayed waveforms for a cycle time (discussed below). For example, the highlighted waveform may have a higher brightness level, a different color and/or a thicker trace than the de-emphasized waveforms. As another example, when the waveforms are displayed in corresponding windows, the waveform emphasis feature may include sequentially positioning the window containing the emphasized waveform in a foreground of the display for a cycle time, such that the window at least partially obscures the windows containing the de-emphasized waveforms. Alternatively, the user may simply select one of the waveforms to be emphasized from among the selected channels through the GUI. The selected waveform then remains emphasized until specifically unselected by the user. When the waveform emphasis feature is not selected, the waveforms from the selected channels are simply displayed without any of them being emphasized or otherwise highlighted with respect to one another.

In block S214, input is received through the GUI indicating a cycle time for sequentially emphasizing each waveform of the selected channels automatically. The cycle time is the duration during which each waveform will be emphasized over the other waveforms, after which a next waveform will be automatically emphasized for the cycle time, and so on. For example, the GUI may include a time field in which the user enters the length of time, for example, by typing in the time, by selecting the time from a drop down list of times provided in the time field, or by selecting individual numbers and units though a scrolling feature in the time field.

Figure 3A:
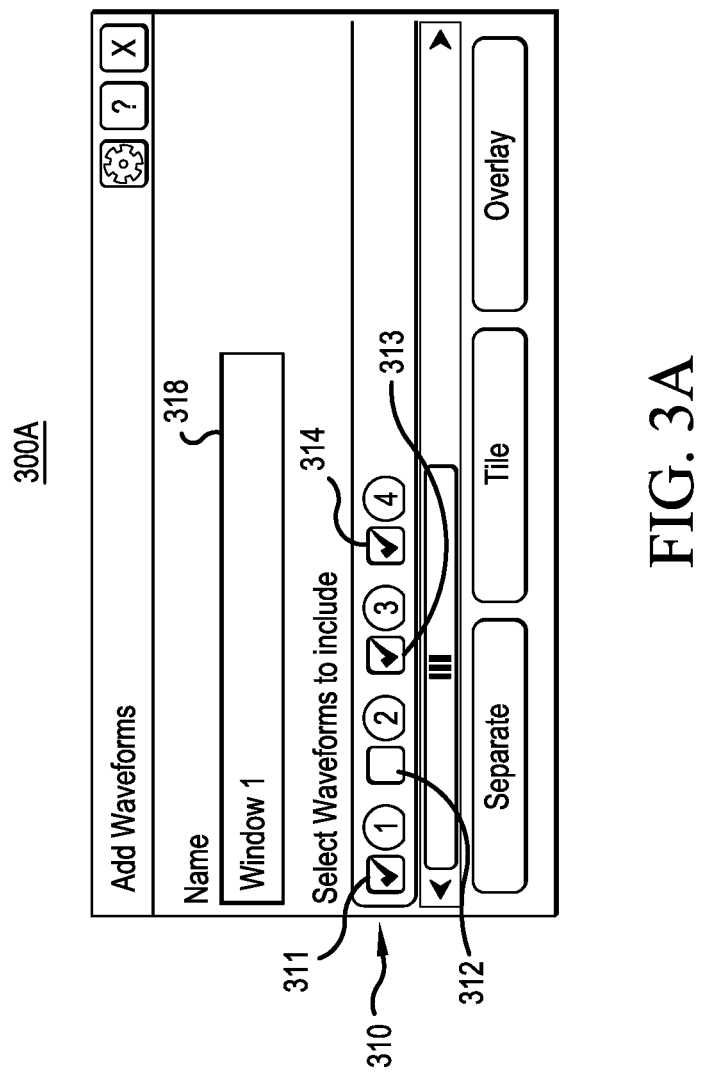
FIG. 3A is a screenshot of an illustrative GUI for selecting channels to be displayed, according to a representative embodiment.
Figure 3B:
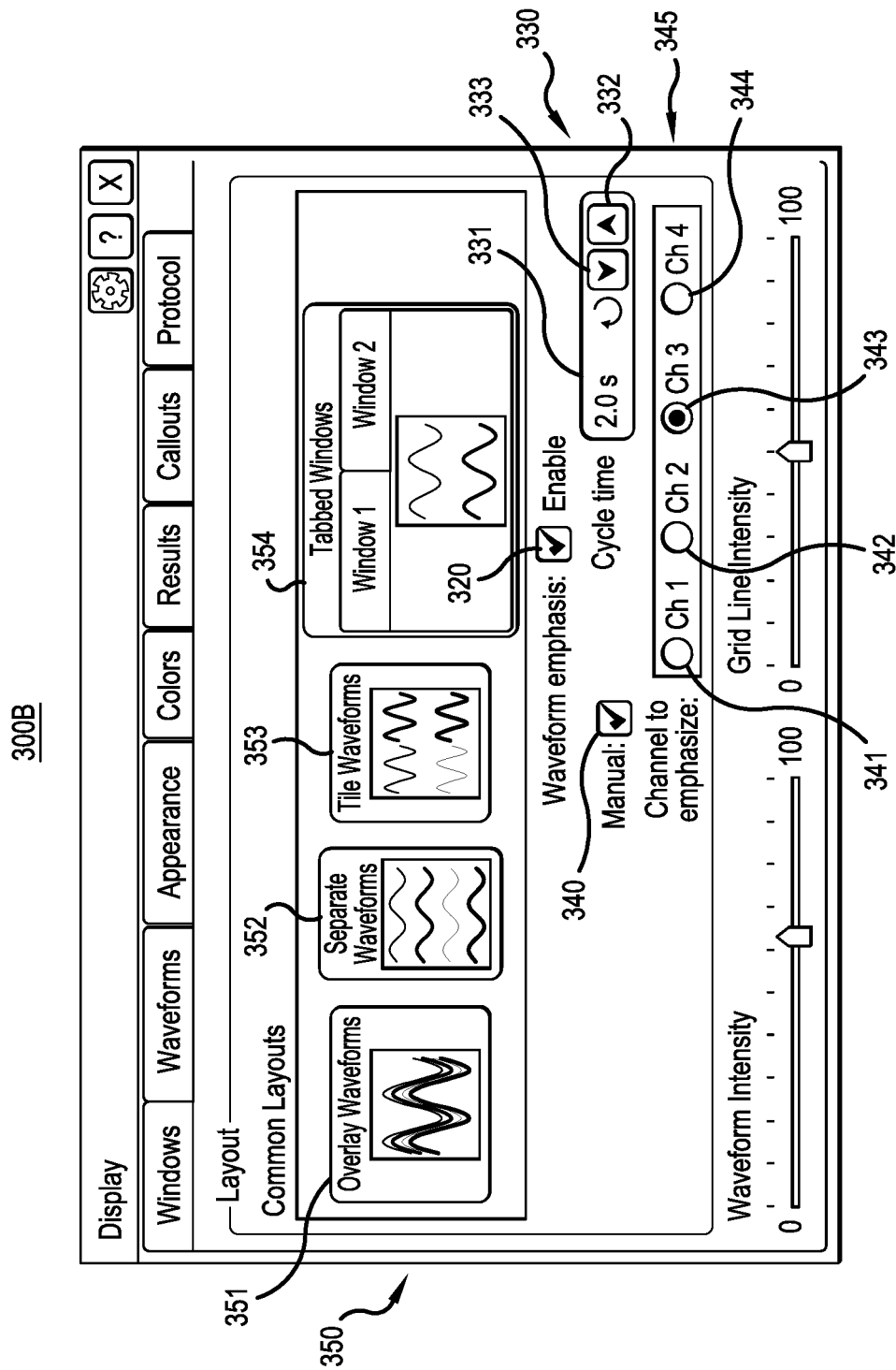
FIG. 3B is a screenshot of an illustrative GUI for selectively emphasizing waveforms on a display of a test system, according to a representative embodiment.

FIG. 3A is a screenshot of an illustrative GUI for selecting channels to be displayed, according to a representative embodiment, and FIG. 3B is a screenshot of an illustrative GUI for selectively emphasizing waveforms on a display, according to a representative embodiment. The layout of each of the GUIs is one example of how to enable receiving of the various inputs needed to selectively emphasize the waveforms. Also, although shown in different figures, it is understood that the GUI in FIG. 3A may be combined with or otherwise displayed within the GUI in FIG. 3B, such that both are displayed simultaneously. For example, the GUI in FIG. 3A may be a pop-up in or situated in a portion of the GUI in FIG. 3B. Of course any other GUI layouts that enable these same selections and inputs would be within the scope of the present teachings.

Referring to FIG. 3A, a GUI display 300A includes graphical elements for turning on channels of the test system to enable display of the corresponding waveforms. The GUI display 300A may be generated and controlled by a display processor (180), and shown on a display (190) for interaction through a GUI (195). In the depicted embodiment, the GUI display 300A includes a channel selection portion 310 for the user to select (turn on) the channels of the test system to show on the display (190). The channel selection portion 310 includes a first button 311 for selecting the first channel (111), a second button 312 for selecting the second channel (112), a third button 313 for selecting the third channel (113), and a fourth button 314 for selecting the fourth channel (114). In the depicted example, the first, third and fourth buttons 311, 313 and 314 are filled in, indicating that the corresponding first, third and fourth channels have been selected for display. The first, second, third and fourth buttons 311, 312, 313 and 314 may be selected and unselected using a pointer controlled by a mouse, touch pad or touch screen, for example.

The GUI display 300A further includes a window identification field 318, which indicates a window in which waveforms provided by each of the selected channels is displayed. In the depicted example, Window 1 has been entered in the window identification field 318, which means that waveforms from the first channel, the third channel and the fourth channel will all be displayed in one window, referred to as Window 1. Of course, any combination of selected channels and windows may be indicated without departing from the scope of the present teachings. For example, each of the selected channels may be displayed in separate windows, respectively, in which case one of the first, second, third and fourth buttons 311, 312, 313 and 314 would be indicated as selected for each window entered in the window identification field 318. The user may type the window directly into the window identification field 318, e.g., using a physical or virtual keyboard. In an alternative embodiment, the window identification field 318 may include a drop down list of available windows, or up and down arrow icons for cycle through available windows, in which case the user may select the window using a pointer controlled by a mouse, touch pad or touch screen, for example. The window identified must be consistent with the selected display mode, discussed below.

Referring to FIG. 3B, a GUI display 300B includes various graphical elements for organizing the presentation of waveforms. The GUI display 300B includes a waveform emphasis enable check box 320, which is selected by the user to enable the waveform emphasis feature of the test system. The waveform emphasis enable check box 320 is shown as having been selected, indicated by a checkmark. In an embodiment, when the waveform emphasis enable check box 320 has not been selected, other graphical features specific to waveform emphasis, such as the cycle time selection and manual control discussed below, are grayed out or hidden from view. The waveform emphasis enable check box 320 may be selected and unselected using a pointer controlled by a mouse, touch pad or touch screen, for example.

The GUI display 300B also includes a cycle time selection portion 330 and a manual control check box 340. The cycle time selection portion 330 is used to set the cycle time of the waveform emphasis, which is the amount of time each waveform is emphasized over the other (de-emphasized)

waveforms from the selected channels. In the depicted embodiment, the cycle time selection portion 330 includes a time field 331 for displaying the identified cycle time in seconds, and an up arrow icon 332 and a down arrow icon 333 for adding and subtracting to the cycle time displayed in the time field 331 until the desired cycle time is displayed. The up and down arrow icons 332 and 333 may be operated using a pointer controlled by a mouse, touch pad or touch screen, for example. In an alternative embodiment, the up and down arrow icons 332 and 333 may be omitted, and the user may type the cycle time directly into the time field 331, e.g., using a physical or virtual keyboard.

The manual control check box 340 is optional, and is provided to enable the user to manually select a waveform to be emphasized for an indefinite time, meaning the selected waveform will remain emphasized until unselected by the user. The manual control and the cycle time are therefore mutually exclusive, since the display will not be automatically cycling through emphasis of the waveforms when the manual control is enabled. In the depicted example, the manual control check box 340 is shown as selected, and thus includes a check mark. In an embodiment, the cycle time selection portion 330 may be disabled, or may be grayed our or hidden from view, when the manual control check box 340 has been selected. In an embodiment, the GUI display 300B may further include a manual channel selection portion 345 for the user to select the channel to emphasize in manual mode on the display (190). The manual channel selection portion 345 includes a first button 341 for selecting the first channel (111), a second button 342 for selecting the second channel (112), a third button 343 for selecting the third channel (113), and a fourth button 344 for selecting the fourth channel (114). In the depicted example, the third button 343, is filled in, indicating that the corresponding third channel is selected as the emphasized waveform in manual mode. The channel that is selected for the manual control is among the channels that have been previously tuned on for display, e.g., using the channel selection portion 310, discussed above. The first, second, third and fourth buttons 341, 342, 343 and 344 may be selected and unselected using a pointer controlled by a mouse, touch pad or touch screen, for example.

Other graphical features of the GUI display 300B are not specific to the waveform emphasis feature, and therefore may be displayed regardless of whether the waveform emphasis has been selected or otherwise activated. For example, the GUI display 300B includes a display mode portion 350 used to select the format in which the waveforms are displayed on the screen. The display mode portion 350 includes selection boxes corresponding to the available display formats, such as a first display format box 351 for selecting the overlay waveforms display format, a second display format box 352 for selecting the separate waveforms display format, a third display format box 353 for selecting the tile waveforms display format, and a fourth display format box 354 for selecting the windows display format. Each of these display formats is discussed above. When one of the first, second, third and fourth display format boxes 351, 352, 353 and 354 is selected, a corresponding outline of the selected format box may be highlighted, for example, indicating the selection. Also, when one display format box selected, any previously selected display format box may automatically be un-highlighted, so that only one display format may be implemented at a time. The first, second, third and fourth display format boxes 351, 352, 353 and 354 may be selected using a pointer controlled by a mouse, touch pad or touch screen, for example.

Referring again to FIG. 2, in block S215, one or more of the waveforms produced by the selected channels are displayed in the display (190) with the GUI (195). For example, referring to FIG. 3B, when the waveform emphasis feature enable check box 320 is selected and the manual control check box 340 is not selected, the waveforms are displayed by sequentially emphasizing the waveforms of the selected channels according to the cycle time. That is, each waveform is sequentially emphasized as a viewable waveform over the other waveforms for the cycle time, while each remaining waveform is de-emphasized relative to the viewable waveform for the cycle time. The remaining waveforms being de-emphasized means that they are either left unaltered or that they are actively changed to reduce viewability in some manner (e.g., such as by dimming, reducing trace thickness, or moving windows containing the waveforms to a background of the display). Notably, the order in which the waveforms are sequentially emphasized may match the numerical order of the corresponding channels by default. Alternatively, the user may select the order in which the waveforms and/or corresponding channels are emphasized using a corresponding graphical element of the GUI. The selective display process is cyclic, meaning that the waveforms are sequentially emphasized for the cycle time in the same order repeatedly. In order to stop the repeating cycle, the user may unselect the waveform emphasis feature enable check box 320, in response to which the cyclic selective display process ends immediately or ends at the completion of the current cycle. Of course, others means of ending the cyclic selective display process, such as another graphical element of the GUI that enables the user to enter a number of cycles or a cycle time, may be incorporated without departing from the scope of the present teachings.

When the waveform emphasis feature enable check box 320 is selected and the manual control check box 340 is also selected, the waveform identified in the manual channel selection portion 345 is displayed. That is, a selected waveform provided by the manually selected channel is emphasized as a viewable waveform over the other waveforms, while each remaining waveform is de-emphasized relative to the viewable waveform. Because there is no cycle time in the manual mode, the selected waveform remains emphasized until the ended by the user. For example, in order to end the display, the user may unselect the waveform emphasis feature enable check box 320 or the user may identify another waveform in the manual channel selection portion 345. Of course, others means of ending the manual display, such as another graphical element of the GUI that enables the user to enter manual display time, may be incorporated without departing from the scope of the present teachings.

As described above, different waveform emphasis features may be available, depending on the manner in which the waveforms from the selected channels are displayed. For example, as discussed with reference to FIG. 4, when the waveforms are displayed in a single window at the same time, the waveform emphasis feature may include sequentially highlighting each of the displayed waveforms relative to the remaining displayed waveforms for the cycle time. As another example, as discussed with reference to FIG. 6, when each of the waveforms is displayed in its own corresponding window, the waveform emphasis feature may include sequentially positioning the windows respectively containing the emphasized waveforms in a foreground of the display for the cycle time, such that the window with the emphasized waveform at least partially obscures the windows with the other waveforms. When the waveform feature enables the user to emphasize one of the waveforms indefinitely in a manual mode, no cycle time is entered through the GUI, and the user simply selects one of the waveforms to be emphasized, either with the other waveforms in the same window or in its own window obscuring the other windows with corresponding waveforms, depending on the selected waveform emphasis feature.

Figure 4:
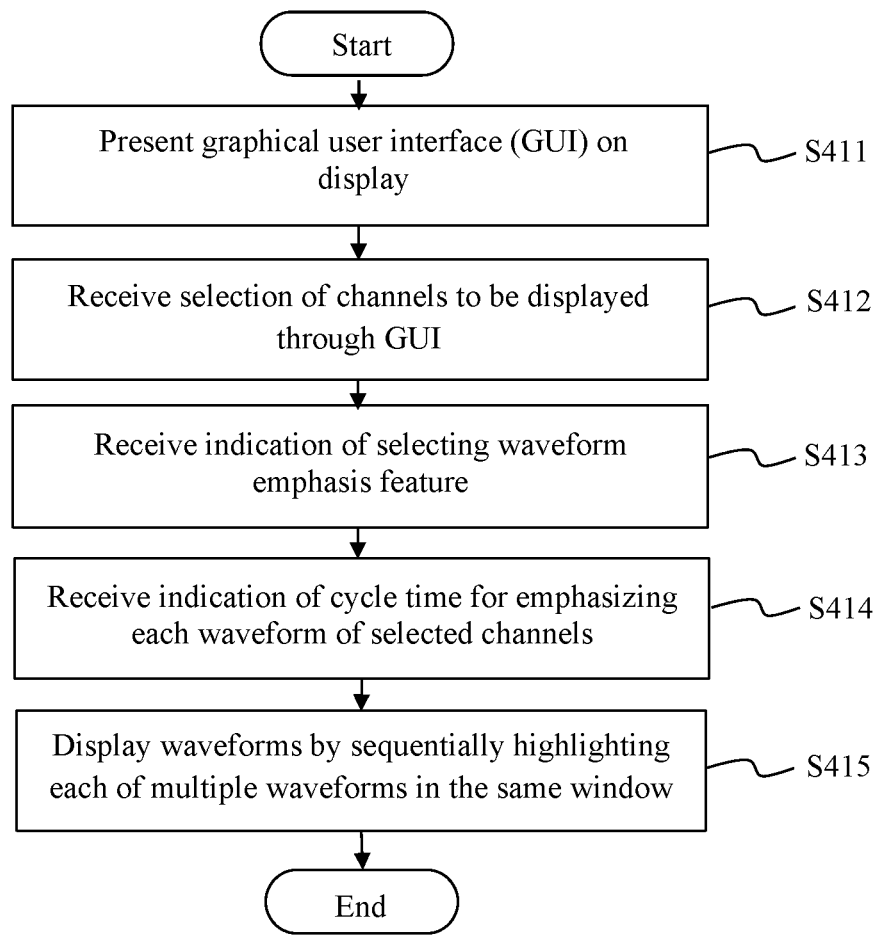
FIG. 4 is a simplified flow diagram showing a method for selectively emphasizing waveforms displayed in the same window on a display of a test system, according to a representative embodiment.

FIG. 4 is a simplified flow diagram showing a method for selectively emphasizing waveforms in the same window on a display of a test system, according to a representative embodiment. The method may be implemented using the test system 100 shown in FIG. 1, for example.

Referring to FIG. 4, a GUI is presented on a display of the test system in block S411 including graphical elements that enable a user to interface with the test system, as discussed above. An example of the GUI presented in block S411 includes the GUI displays 300A and 300B, although other configurations of the GUI that provide the same functionality as the GUI displays 300A and 300B may be incorporated without departing from the scope of the present teachings.

In block S412, input is received through the GUI indicating a selection of channels from among multiple channels of the test system to be viewed on the display. The multiple channels respectively produce waveforms from signals received through corresponding inputs. The waveforms associated with the channels may be provided to the GUI through a DSP and a display processor, as discussed above. The channels may be selected using the channel selection portion 310 of the GUI display 300A, for example.

In block S413, input is received through the GUI indicating selection by the user of the waveform emphasis feature. The waveform emphasis feature may be selected or enabled using the waveform emphasis feature enable check box 320 of the GUI display 300B, for example. In an embodiment, the type of waveform emphasis feature that is implemented depends in part on the display format. Since FIG. 4 is directed to a method of displaying multiple waveforms in the same window, the selected display format must be one that displays waveforms in the same window, such as the overlay waveforms display format, the separate waveforms display format, or tile waveforms display format, for example. When one of these display formats has been selected, for example, by selecting one of the first, second or third format boxes 351, 352 or 353 in the GUI display 300B, displaying multiple waveforms in the same window is automatically implemented when the waveform emphasis feature is enabled. In an alternative embodiment, the manner in which the multiple waveforms are emphasized may be selected separately by the user using another graphical feature of the GUI that identifies the available waveform emphasis features. This would involve a separate selection step (not shown in FIG. 4) for identifying the waveform emphasis feature to be implemented.

In block S414, input is received through the GUI indicating a cycle time for sequentially emphasizing each waveform of the selected channels automatically within the same window. The cycle time is the duration during which each waveform will be emphasized over the other waveforms, after which a next waveform will be automatically emphasized for the cycle time, and so on. The cycle time may be entered or selected using the cycle time selection portion 330 of the GUI display 300B, for example.

In block S415, the waveforms produced by the selected channels are displayed in the same window on the display through the GUI in a display format selected by the user. In response to the waveform emphasis feature being enabled, each waveform is sequentially emphasized (highlighted) in a highlighted condition as a viewable waveform over the other waveforms for the cycle time, while each remaining waveform is de-emphasized relative to the viewable waveform in an unhighlighted condition for the cycle time. The order in which the waveforms are sequentially emphasized may match the numerical order of the corresponding channels by default, or the GUI may include a graphical element enabling the user to select the order in which the waveforms and/or corresponding channels are emphasized. The waveforms are sequentially emphasized for the cycle time in the same order repeatedly until the selective display process is ended by the user through the GUI, e.g., by unselecting the waveform emphasis feature enable check box 320 in the GUI display 300B.

The waveforms may be sequentially emphasized over the other waveforms in the window in any manner that makes one of the waveforms visually stand out in the display as a viewable waveform in relation to the others (for the cycle time). That is, the emphasized waveform may be displayed in the highlighted condition for the cycle time, while each remaining (de-emphasized) waveform is displayed in the unhighlighted condition for the cycle time.

For example, the emphasized waveform may be displayed at a first brightness for the cycle time, while each remaining (de-emphasized) waveform is displayed at a second brightness for the cycle time, where the second brightness is less than the first brightness. The relative brightnesses may be achieved in any of a variety of ways. For example, the first brightness may be an increased brightness while the second brightness is maintained at a normal brightness, or the first brightness may be the normal brightness while the second brightness is a reduced brightness, or the first brightness may be an increased brightness while the second brightness is a reduced brightness. For example, the second brightness may be less than about 25 percent of the first brightness. In another embodiment, the emphasized waveform may be displayed at a first trace thickness for the cycle time, while each remaining waveform is displayed at a second trace thickness for the cycle time, where the second trace thickness is less than the first trace thickness. Again, relative thicknesses may be achieved in any of a variety of ways. For example, the first thickness may be an increased thickness while the second thickness is maintained at a normal thickness, or the first thickness may be the normal thickness while the second thickness is a reduced thickness, or the first thickness may be an increased thickness while the second thickness is a reduced thickness. In still another embodiment, the emphasized waveform may be a different, more visible color than the other waveforms. For example, the emphasized waveform may be displayed on a black background in bright red, orange or yellow for the cycle time, while the other waveforms are displayed in blue, brown or gray, for example. It is understood that any display technique that clearly, visually distinguishes the emphasized (viewable) waveform over the other waveforms in the same window may be incorporated without departing from the present teachings.

So, for example, referring to FIGS. 1 and 4, the user may select the first channel 111, the third channel 113 and the fourth channel 114 for the selective display process through the GUI 195. The user may further set the cycle time to two seconds through the GUI 195. In this case, the first waveform will be emphasized on the display 190 for two seconds while the third and fourth waveforms are de-emphasized, the third waveform will then be emphasized for two seconds while the first and fourth waveforms are de-emphasized, and the fourth waveform will then be emphasized for two seconds while the first and third waveforms are de-emphasized. This process repeats, again emphasizing the first waveform for two seconds, the third waveform for two seconds, and the fourth waveform for two seconds, in the same order, until it comes to an end, e.g., by the user unselecting the waveform emphasis feature.

Figure 5:
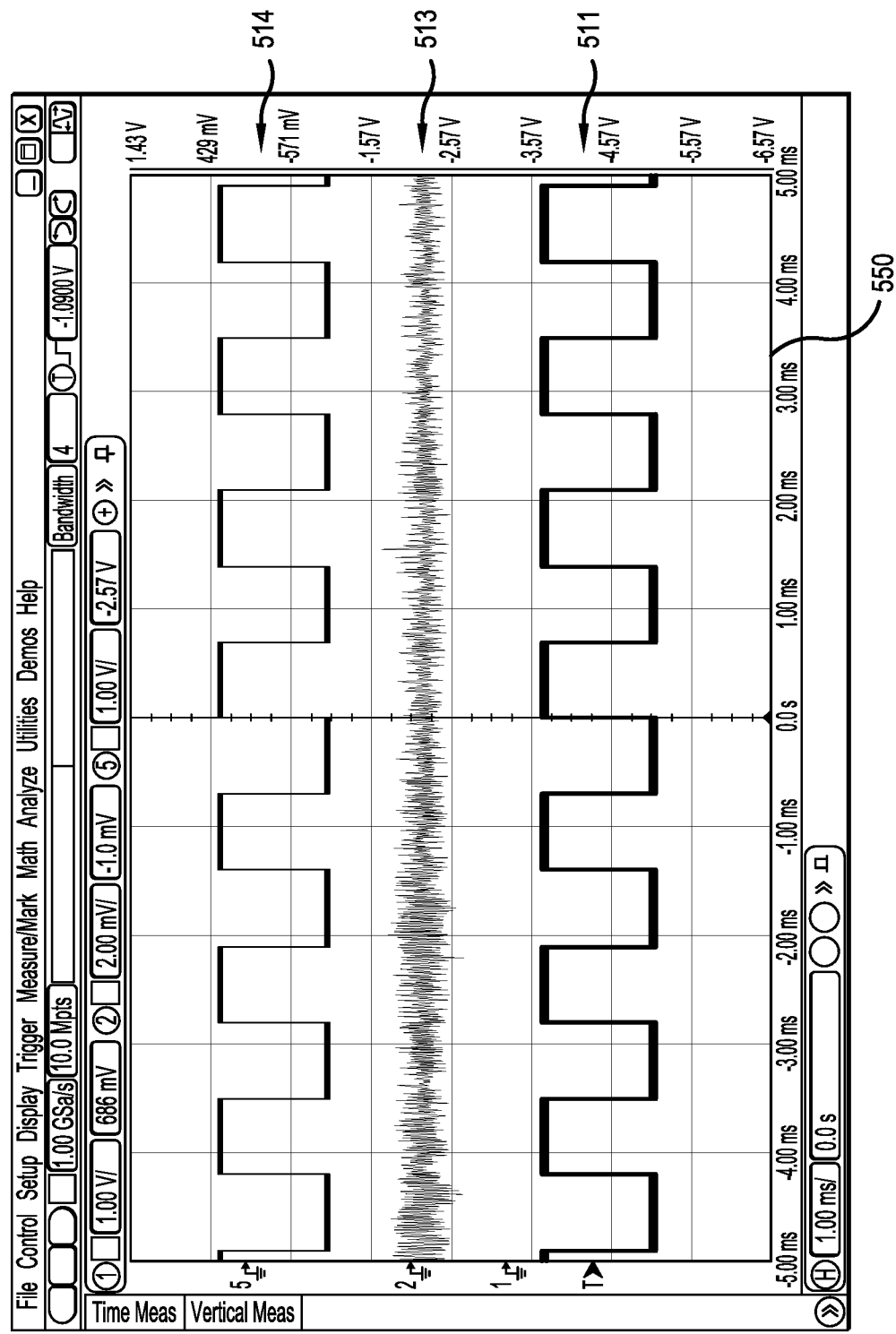
FIG. 5 is a screenshot of an illustrative GUI for selectively emphasizing waveforms displayed in a single window, according to a representative embodiment.

FIG. 5 is a screenshot of an illustrative GUI display for selectively emphasizing waveforms displayed in a single window, according to a representative embodiment.

Referring to FIG. 5, a GUI display 500 shows three waveforms corresponding to selected channels of a test system being displayed in the same window. The GUI display 500 may be generated and controlled by a display processor (180), and shown on the display (190) for interaction through a GUI (195).

In the depicted example, a user has selected the first channel (111), the third channel (113) and the fourth channel (114) for display in a single window 550 in a separate waveforms display format (e.g., selected pursuant to second display format box 352, discussed above). Accordingly, the window 550 shows a first waveform 511 corresponding to the first channel, a third waveform 513 corresponding to the third channel, and a fourth waveform 514 corresponding to the fourth channel. The screenshot of the GUI display 500 is captured at a time in the selective display process when the first waveform 511 is emphasized, and the third and fourth waveforms 513 and 514 are de-emphasized. In depicted example, this is shown by the first waveform 511 having a higher brightness than the third and fourth waveforms 513 and 514, although the first waveform 511 may be emphasized by other techniques, such as having a thicker trace and/or a brighter color, as discussed above, without departing from the scope of the present teachings.

Figure 6:
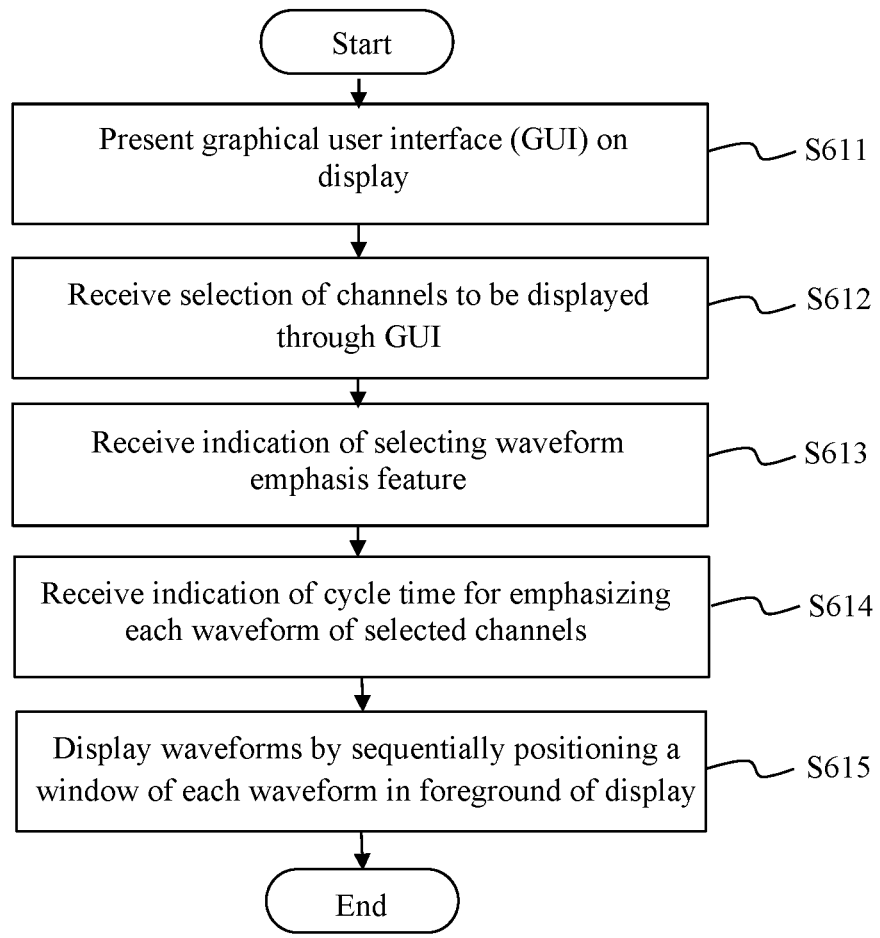
FIG. 6 is a simplified flow diagram showing a method for selectively emphasizing waveforms displayed in corresponding windows on a display of a test system, according to a representative embodiment.

FIG. 6 is a simplified flow diagram showing a method for selectively emphasizing waveforms in corresponding windows on a display of a test system, according to a representative embodiment. The method may be implemented using the test system 100 shown in FIG. 1, for example.

Referring to FIG. 6, a GUI is presented on a display of the test system in block S611 including graphical elements that enable a user to interface with the test system, as discussed above. An example of the GUI presented in block S611 includes the GUI displays 300A and 300B, although other configurations of the GUI that provide the same functionality as the GUI displays 300A and 300B may be incorporated without departing from the scope of the present teachings.

In block S612, input is received through the GUI indicating a selection of channels from among multiple channels of the test instrument to be viewed on the display. The multiple channels respectively produce waveforms from signals received through corresponding inputs. The waveforms associated with the channels are provided to the GUI through a DSP and a display processor, as discussed above. The channels may be selected using the channel selection portion 310 of the GUI display 300A, for example.

In block S613, input is received through the GUI indicating selection by the user of the waveform emphasis feature. The waveform emphasis feature may be selected or enabled using the waveform emphasis feature enable check box 320 of the GUI display 300B, for example. As discussed above, in an embodiment, the type of waveform emphasis feature that is implemented depends in part on the display format. Since FIG. 6 is directed to a method of displaying multiple waveforms in corresponding multiple windows, the selected display format must be one that displays waveforms in their own windows, such as the windows display format.

In this case, displaying each waveform in a separate window, visually stacked on one another, may be implemented when the waveform emphasis feature is enabled, for example, by selecting the fourth format box 354 in the GUI display 300B. In an alternative embodiment, emphasizing the multiple waveforms in multiple windows may be selected separately by the user using another graphical feature of the GUI that identifies the available waveform emphasis features.

In block S614, input is received through the GUI indicating a cycle time for sequentially emphasizing each waveform of the selected channels automatically within a corresponding window. The cycle time is the duration during which the window corresponding to each waveform is positioned in the foreground of the display, such that the waveform will be emphasized over the other waveforms, after which a next waveform will be automatically emphasized for the cycle time, and so on. The cycle time may be entered or selected using the cycle time selection portion 330 of the GUI display 300B, for example.

In block S615, the waveforms produced by the selected channels are displayed in corresponding windows that are visually stacked, where a front window shows the emphasized waveform for the cycle time, and at least partially obscures the other windows corresponding to the remaining waveforms, respectively. In other words, the waveforms are sequentially emphasized by sequentially positioning the window showing each waveform in a foreground of the display as a viewable waveform for the cycle time, while positioning each remaining window showing each remaining waveform behind the window showing the viewable waveform for the cycle time. The window showing the viewable waveform at least partially obscures each remaining window. The order in which the waveforms are sequentially emphasized in this manner may match the numerical order of the corresponding channels by default, or the GUI may include a graphical element enabling the user to select the order in which the waveforms and/or corresponding channels are emphasized. Also, the waveforms are sequentially emphasized for the cycle time in the same order repeatedly until the cyclic selective display process comes to an end, e.g., by the user unselecting the waveform emphasis feature.

Figure 7:
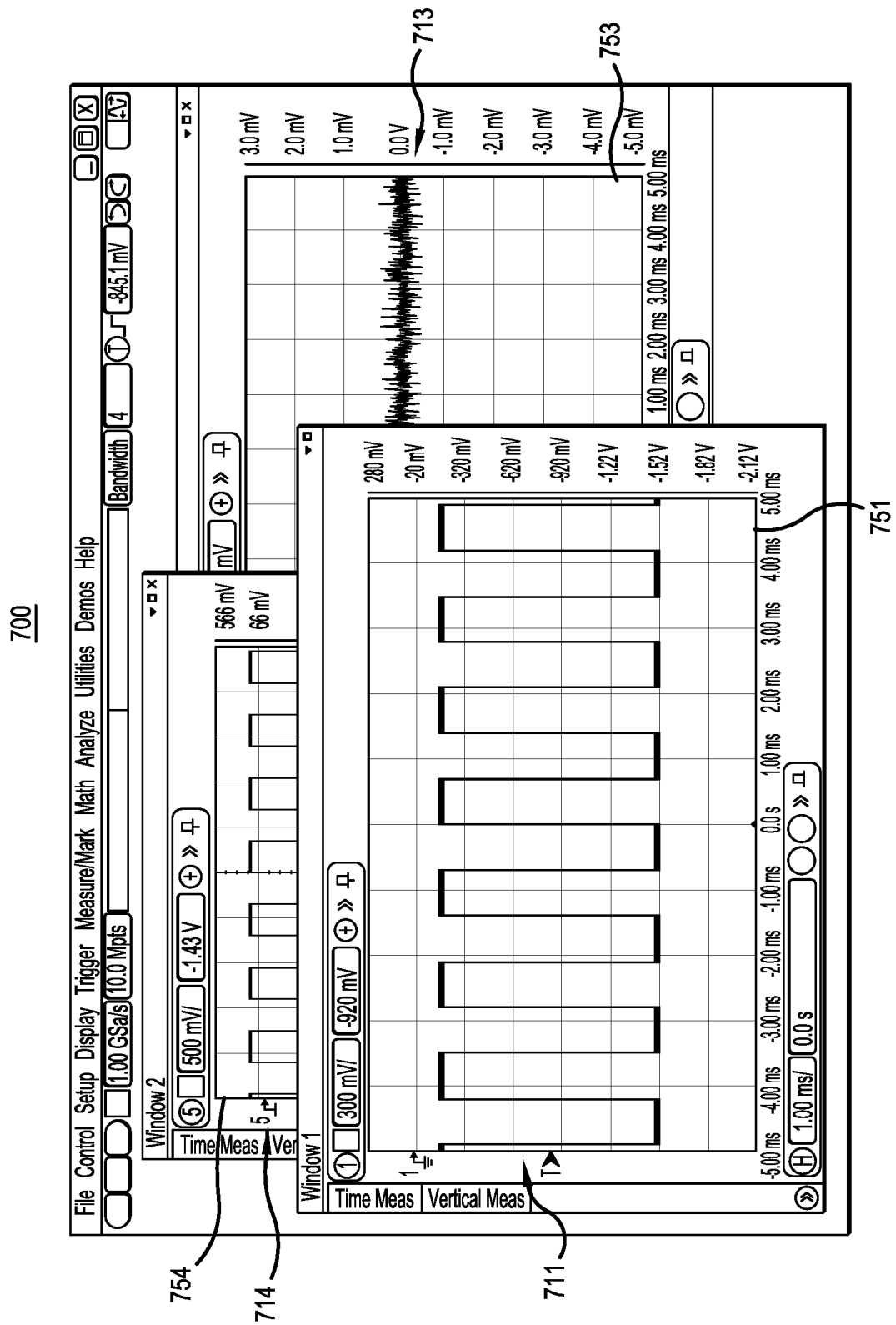
FIG. 7 is a screenshot of an illustrative GUI for selectively emphasizing waveforms displayed in corresponding windows, according to a representative embodiment.

The windows showing the emphasized waveforms may partially or fully obscure the windows showing the de-emphasized waveforms. For example, to partially obscure the windows showing the de-emphasized waveforms, the window showing the emphasized waveform is positioned in the foreground of the display and may occupy only a portion of the screen. Accordingly, the windows showing the de-emphasized waveforms are visually stacked behind the window in the foreground, such that a portion of each of these windows is visible behind the window in the foreground. FIG. 7 shows an example of this arrangement.

Figure 8:
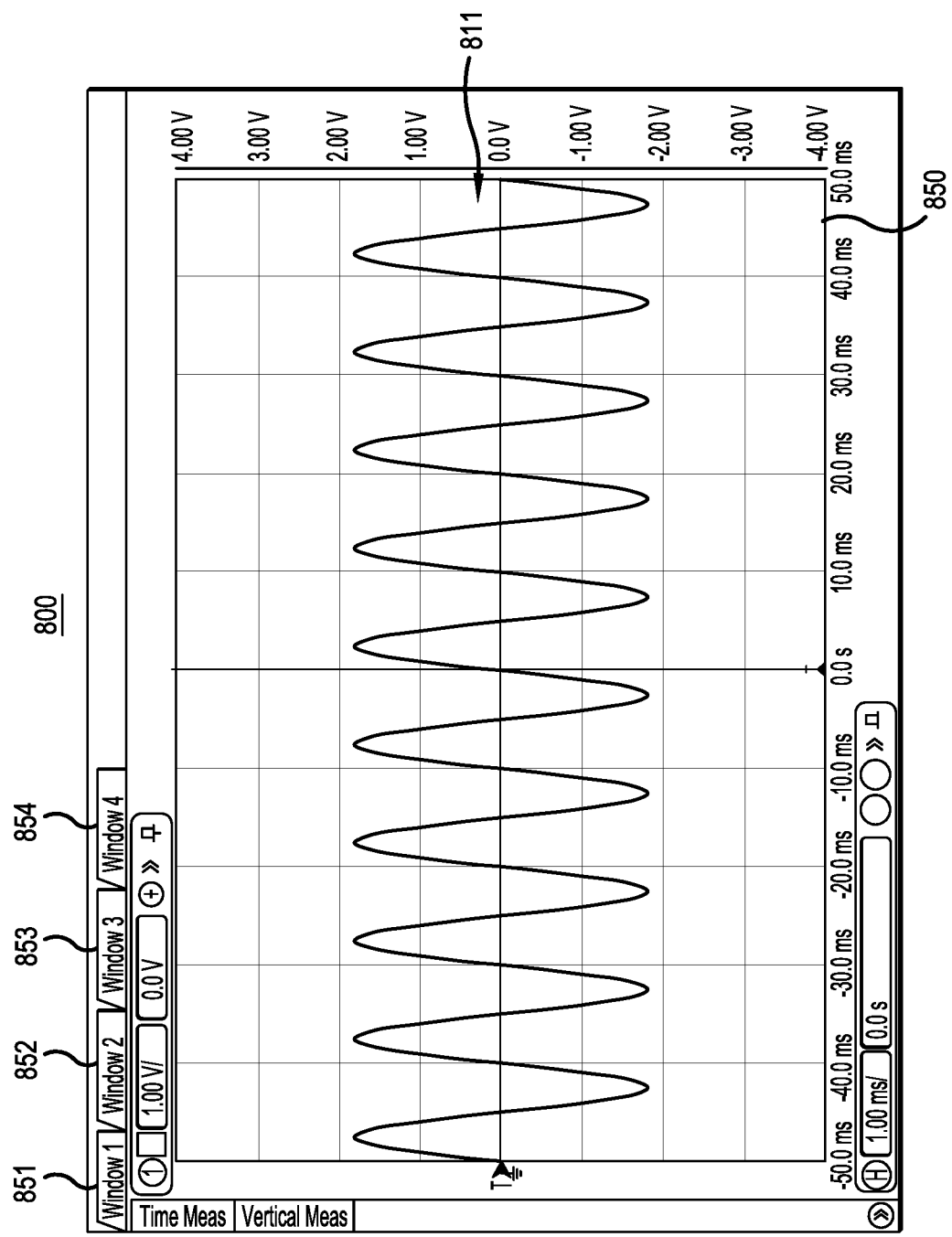
FIG. 8 is a screenshot of an illustrative GUI for selectively emphasizing waveforms displayed in corresponding tabbed windows, according to a representative embodiment.

As another example, to fully obscure the windows showing the de-emphasized waveforms, the window showing the emphasized waveform is positioned in the foreground of the display and occupies the entirety of the screen that is available for displaying windows. Accordingly, the windows showing the de-emphasized waveforms are not visible behind the window in the foreground. In this example, the windows showing the waveforms may be tabbed, respectively, in which case tabs corresponding to the windows are always visible, e.g., at the top of the GUI display, to enable selection of the tabbed windows even when the tabbed windows themselves are not visible (e.g., are completely obscured by another window positioned in the foreground of the display). FIG. 8 shows an example of tabbed windows.

When tabbed windows are used, sequentially positioning each window showing a waveform in the foreground of the display includes sequentially selecting each tab and sequentially positioning each tabbed window corresponding to the selected tab in front of each remaining window for the cycle time, such that the corresponding waveform of the front tabbed window is in the foreground of the display as the viewable waveform for the cycle time.

So, for example, referring to FIGS. 1 and 6, the user may select the first channel 111, the third channel 113 and the fourth channel 114 for the selective display process through the GUI 195. The user may further set the cycle time to two seconds through the GUI 195. In this case, the first waveform will be emphasized in the display 190 by positioning a first window showing the first waveform in the foreground for two seconds while the third and fourth waveforms are de-emphasized by positioning third and fourth windows showing the third and fourth waveforms, respectively, behind the first window. Then, the third waveform will be emphasized in the display 190 by positioning the third window showing the third waveform in the foreground for two seconds while the first and fourth waveforms are de-emphasized by positioning the first and fourth windows behind the third window. Then, the fourth waveform will be emphasized in the display 190 by positioning the fourth window showing the fourth waveform in the foreground for two seconds while the first and third waveforms are de-emphasized by positioning the first and third windows behind the fourth window. This process repeats, again emphasizing the first waveform for two seconds, the third waveform for two seconds, and the fourth waveform for two seconds, in the same order, and until it comes to an end, e.g., by the user unselecting the waveform emphasis feature.

FIG. 7 is a screenshot of an illustrative GUI for selectively emphasizing waveforms displayed in corresponding windows, according to a representative embodiment.

Referring to FIG. 7, a GUI display 700 shows three waveforms corresponding to selected channels of a test instrument being at least partially displayed in corresponding windows. The GUI display 700 may be generated and controlled by a display processor (180), and shown in the display (190) for interaction through a GUI (195).

In the depicted example, a user has selected the first channel (111), the third channel (113) and the fourth channel (114) for display in corresponding windows in a windows display format (e.g., selected pursuant to fourth display format box 354, discussed above). In particular, a first window 751 shows a first waveform 711 corresponding to the first channel, a third window 753 shows a third waveform 713 corresponding to the third channel, and a fourth window 754 shows a fourth waveform 714 corresponding to the fourth channel. The screen shot of the GUI display 700 is captured at a time in the selective display process when the first waveform 711 is emphasized, and the third and fourth waveforms 713 and 714 are de-emphasized. Thus, in depicted example, this is shown by the first window 751 being positioned in the foreground of the GUI display 700, thereby emphasizing the first waveform 711. Also, the third window 753 is positioned behind and is partially obscured by the first window 751, and the fourth window 754 is positioned behind and is partially obscured by the first window 751 and the third window 753. This arrangement gives a visually stacked appearance, in which the first window 751 is stacked on the third window 753 which is stacked on the fourth window 754. As the waveforms are sequentially emphasized, the top window moves to the bottom of the stack, and the waveform shown in the next consecutive window moving to the top of the stack is then emphasized. So, for example, after the cycle time, the first window 751 would be repositioned at the bottom of the stack, and the third window 753 would be positioned in the foreground of the GUI display 700 to emphasize the third waveform for the cycle time, giving a visually stacked appearance, in which the third window 753 is stacked on the fourth window 754 which is stacked on the first window 751. In the same manner, during the next cycle time, the windows would be arranged to give a visually stacked appearance, in which the fourth window 754 is stacked on the first window 751 which is stacked on the third window 753. The cycle would repeat for the predetermined or specified time and/or number of repetitions.

FIG. 8 is a screenshot of an illustrative GUI for selectively emphasizing waveforms displayed in corresponding tabbed windows, according to a representative embodiment.

In the event that the first, third and fourth waveforms are shown in tabbed windows, the same process takes place, except that the window in the foreground showing the emphasized waveform would completely obscure the other two windows for the cycle time. Accordingly, referring to FIG. 8, a GUI display 800 shows four tabs corresponding to four windows, each of which contains a waveform corresponding to a selected channel of a test system. The GUI display 700 may be generated and controlled by a display processor (180), and shown in the display (190) for interaction through a GUI (195).

More particularly, in the depicted example, the GUI display 800 includes a first tab 851 corresponding to a first window (first window 850), a second tab 852 corresponding to a second window, a third tab 853 corresponding to a third window, and a fourth tab 854 corresponding to a fourth window. The first tab 851 is highlighted, indicating that it has been selected and/or that the corresponding first window 850 is currently being emphasized in the selective display process. Therefore, the first window 850 containing a first waveform 811 is being displayed. The second, third and fourth windows, corresponding to the second, third and fourth tabs 852, 853 and 854, and containing de-emphasized waveforms, are completely hidden or obscured by the first window 850.

Figure 9:
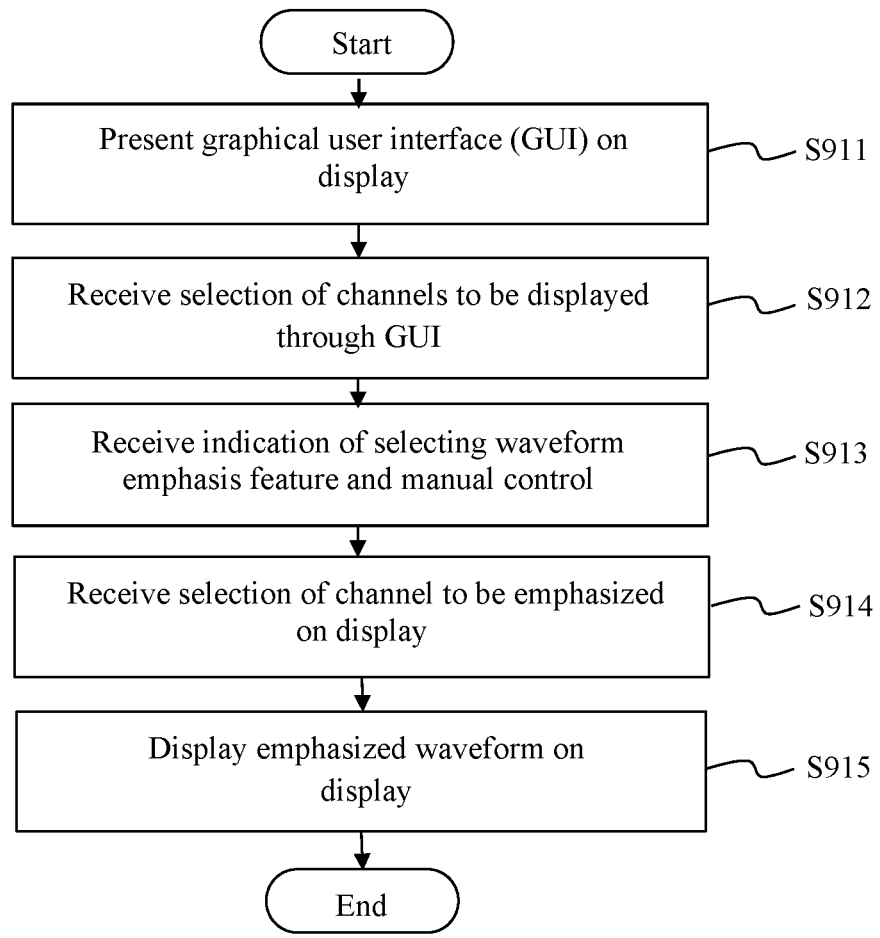
FIG. 9 is a simplified flow diagram showing a method for selectively emphasizing a waveform on a display of a test system, according to a representative embodiment.

FIG. 9 is a simplified flow diagram showing a method for selectively emphasizing a waveform on a display of a test system, according to a representative embodiment. The method may be implemented using the test system 100 shown in FIG. 1, for example.

Referring to FIG. 9, a GUI is presented on a display of the test system in block S911 including graphical elements that enable a user to interface with the test system, as discussed above. An example of the GUI presented in block S911 includes the GUI displays 300A and 300B, although other configurations of the GUI that provide the same functionality as the GUI displays 300A and 300B may be incorporated without departing from the scope of the present teachings.

In block S912, input is received through the GUI indicating a selection of channels from among multiple channels of the test system to be viewed on the display. The multiple channels respectively produce waveforms from signals received through corresponding inputs. The waveforms associated with the channels may be provided to the GUI through a DSP and a display processor, as discussed above. The channels may be selected using the channel selection portion 310 of the GUI display 300A, for example.

In block S913, input is received indicating selection by the user of the waveform emphasis feature, and indicating manual control. The waveform emphasis feature may be selected or enabled using the waveform emphasis feature enable check box 320 and manual control may be selected or enable using the manual control check box 340 of the GUI display 300B, for example. In an embodiment, the type of waveform emphasis feature that is implemented depends in part on the display format, which is selected using one of the first, second, third and fourth format boxes 351, 352, 353 and 354 in the GUI display 300B. For example, when one of the overlay waveforms, separate waveforms or tile waveforms display formats is selected, the emphasized waveform is displayed in the same window as the other (de-emphasized) waveforms, and when the windows display format is selected, the emphasized waveform is displayed in its own window positioned in the foreground of the display, in front of windows showing the other (de-emphasized) waveforms. In an alternative embodiment, the manner in which the multiple waveforms are emphasized may be selected separately by the user using another graphical feature of the GUI that identifies the available waveform emphasis features. This would involve a separate selection step (not shown in FIG. 9) for identifying the waveform emphasis feature to be implemented.

In block S914, input is received through the GUI selecting a particular channel to be emphasized in the display. The channel may be selected, for example, using the manual channel selection portion 345, where on of the first, second, third or fourth buttons 341, 342, 343 or 344 in the GUI display 300B is selected.

In block S915, the waveform produced by the manually selected channel is displayed in the display such that it is emphasized over the other waveforms from the unselected channels. That is, when the waveforms are shown in the same window, the manually selected channel is emphasized (highlighted) as a viewable waveform, e.g., by adjusting at least one of brightness, trace thickness or color, while each remaining waveform is de-emphasized relative to the viewable waveform in the same window. The waveforms may therefore appear, for example, as the first, third and fourth waveforms 511, 513 and 514, shown in the window 550 of the GUI display 500 in FIG. 5, but with no automatic cycling. When the waveforms are shown in the different windows, respectively, the manually selected channel is emphasized as a viewable waveform by positioning the window showing the emphasized waveform in the foreground of the display, while the windows showing the remaining waveforms are positioned behind the window showing the viewable waveform, which at least partially obscures the other windows. The waveforms may therefore appear, for example, as the first, third and fourth waveforms 711, 713 and 714, shown in the first, third and fourth windows 751, 753, and 754 of the GUI display 700 in FIG. 7, but with no automatic cycling. The waveforms and corresponding windows are emphasized until the process is ended by the user through the GUI, e.g., by unselecting the waveform emphasis feature enable check box 320 and/or by unselecting the manual control check box 340 in the GUI display 300B.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of selectively emphasizing waveforms on a display of a test system, the method comprising:
   presenting a graphical user interface (GUI) on the display of the test system;
   providing a plurality of graphical elements in the GUI corresponding to a plurality of available channels for receiving a selection of a plurality of select channels from the plurality of available channels to be viewed on the display;
   providing a waveform emphasis graphical element in the GUI for receiving an indication enabling a waveform emphasis feature;
   providing a time graphical element in the GUI for receiving an indication of a cycle time;
   providing a plurality of display format graphical elements in the GUI corresponding to a plurality of available display formats for receiving a selection of a select display format from the plurality of available display formats in which a plurality of waveforms, respectively produced by the plurality of select channels, are displayable on the display; and
   when the waveform emphasis feature is enabled, displaying through the GUI the plurality of waveforms from the select channels in the select display format by sequentially emphasizing each waveform of the plurality of waveforms for the cycle time as a viewable waveform, while de-emphasizing each remaining waveform of the plurality of waveforms in relation to the emphasized waveform for the cycle time,
   wherein the plurality of available display formats comprises at least an overlay waveforms display format in which the plurality of waveforms are shown simultaneously in a single window on a same grid and at least one individual display format in which the plurality of waveforms are displayed simultaneously in a single window on corresponding separate grids, respectively.

2. The method of claim 1, wherein the plurality of available display formats further comprises a windows display format in which the plurality of waveforms are shown in a corresponding plurality of windows, and
   wherein sequentially emphasizing each waveform in the windows display format comprises sequentially positioning each window of the plurality of windows in a foreground of the display for the cycle time, such that the corresponding waveform is displayed as the viewable waveform, while positioning each remaining window of the plurality of windows behind the window positioned in the foreground for the cycle time, the window positioned in the foreground at least partially obscuring each remaining window.

3. The method of claim 2, further comprising:
providing a plurality of tabs in the GUI for selecting the plurality of windows, respectively,
wherein sequentially positioning each window in the foreground of the display comprises sequentially selecting each tab of the plurality of tabs and sequentially positioning each window of the plurality of windows corresponding to the selected tab in front of each remaining window of the plurality of windows for the cycle time.

4. The method of claim 2, wherein the plurality of channels have predetermined channel numbers, and
wherein the plurality of windows are sequentially positioned in the foreground of the display in an order of the predetermined channel numbers of the select channels respectively producing the corresponding plurality of waveforms.

5. The method of claim 1, wherein the GUI further includes a time field for inputting the cycle time.

6. The method of claim 1,
wherein sequentially emphasizing each waveform in the at least one individual display format comprises sequentially highlighting each waveform of the plurality of waveforms as the viewable waveform in a highlighted condition for the cycle time, while displaying each remaining waveform of the plurality of waveforms in an unhighlighted condition for the cycle time.

7. The method of claim 6, wherein the highlighted condition comprises a first brightness, and the unhighlighted condition comprises a second brightness that is less than the first brightness, emphasizing the viewable waveform.

8. The method of claim 6, wherein the highlighted condition comprises a first thickness, and the unhighlighted condition comprises a second thickness that is less than the first thickness, emphasizing the viewable waveform.

9. The method of claim 6, wherein the highlighted condition comprises a first color, and the unhighlighted condition comprises a second color that is less bright than the first color, emphasizing the viewable waveform.

10. The method of claim 6, wherein the plurality of channels have predetermined channel numbers, and
wherein the plurality of waveforms are sequentially emphasized in the highlighted condition in an order of the predetermined channel numbers of the select channels producing the plurality of waveforms, respectively.

11. The method of claim 1, wherein the at least one individual display format comprises at least one of a separate waveforms display format in which all of the plurality of waveforms are displayed in separate, vertically stacked grids, or a tile waveforms display format in which the plurality of waveforms are displayed in separate, divided portions of the display.

12. The method of claim 1, wherein sequentially emphasizing each waveform of the plurality of waveforms in the overlay waveforms display format comprises sequentially highlighting each waveform as the viewable waveform in a highlighted condition for the cycle time, while displaying each remaining waveform of the plurality of waveforms in an unhighlighted condition for the cycle time.

13. A system for selectively emphasizing displayed waveforms, the system comprising:
a plurality of channels for receiving a plurality of signals and producing a corresponding plurality of waveforms, respectively;
a processor for processing the plurality of waveforms;
a display communicating with the processor for presenting a graphical user interface (GUI), wherein the GUI provides a plurality of graphical elements corresponding to the plurality of channels, a waveform emphasis graphical element for enabling a waveform emphasis feature, a time graphical element, and a plurality of display format graphical elements corresponding to a plurality of available display formats;
an interface communicating with the processor for receiving commands from a user responsive to the GUI; and
a memory communicating with the processor, the memory storing instructions that, when executed by the processor, cause the processor to:
receive through the plurality of graphical elements corresponding to the plurality of channels a selection of a plurality of select channels from the plurality of channels to be viewed on the display;
receive through the time graphical element an indication of a cycle time;
receive through the plurality of display format graphical elements a selection of a select display format from the plurality of available display formats in which a plurality of waveforms from the plurality of select channels are displayable on the display; and
when the waveform emphasis feature is enabled, display on the display the plurality of waveforms of the corresponding plurality of select channels in the select display format by sequentially emphasizing each waveform of the plurality of waveforms as a viewable waveform for the cycle time, while de-emphasizing each remaining waveform of the plurality of waveforms in relation to the viewable waveform for the cycle time,
wherein the plurality of available display formats comprise at least an overlay waveforms display format in which the plurality of waveforms are shown simultaneously in a single window on a same grid and at least one individual display format in which the plurality of waveforms are displayed simultaneously with corresponding separate grids.

14. The system of claim 13, wherein the plurality of available display formats further comprises a windows display format in which the plurality of waveforms are shown in a corresponding plurality of windows, and
wherein sequentially emphasizing each waveform of the plurality of waveforms in the windows display format comprises sequentially positioning each window of the plurality of windows in a foreground of the display for the cycle time, such that the corresponding waveform is displayed as the viewable waveform, while positioning each remaining window of the plurality of windows behind the window positioned in the foreground for the cycle time, the window positioned in the foreground at least partially obscuring each remaining window.

15. The system of claim 13, wherein sequentially emphasizing each waveform of the of the plurality of waveforms in the overlay waveforms display format comprises sequentially highlighting each waveform as the viewable waveform in a highlighted condition for the cycle time, while displaying each remaining waveform of the plurality of waveforms in an unhighlighted condition for the cycle time.

16. The system of claim 15, wherein the highlighted condition comprises a first brightness, and the unhighlighted condition comprises a second brightness that is less than the first brightness, emphasizing the viewable waveform.

17. The system of claim 13, wherein the at least one individual display format comprises at least one of a separate waveforms display format in which all of the plurality of waveforms are displayed in separate vertically stacked grids, or a tile waveforms display format in which the plurality of waveforms are displayed in separate divided portions of the display, and wherein emphasizing each waveform comprises highlighting the waveform as the viewable waveform in a highlighted condition, while displaying each remaining waveform of the plurality of waveforms in an unhighlighted condition.

\* \* \* \* \*